(12) United States Patent
Ho et al.

(10) Patent No.: US 7,473,641 B2
(45) Date of Patent: Jan. 6, 2009

(54) METHOD FOR MANUFACTURING A SEMICONDUCTOR DEVICE, METHOD FOR MANUFACTURING MAGNETIC MEMORY, AND THE MAGNETIC MEMORY THEREOF

(75) Inventors: Ching-Yuan Ho, Hsinchu (TW); Yung-Hsiang Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 118 days.

(21) Appl. No.: 11/489,630

(22) Filed: Jul. 20, 2006

(65) Prior Publication Data

US 2007/0155026 A1    Jul. 5, 2007

(30) Foreign Application Priority Data

Jan. 4, 2006    (TW) .............................. 95100379 A

(51) Int. Cl.
*H01L 21/44* (2006.01)
*H01L 21/4763* (2006.01)

(52) U.S. Cl. ..................... 438/672; 438/636; 438/642; 438/675

(58) Field of Classification Search ............... 438/672, 438/694, 761, 633, 638, 675, 618, 642, 636
See application file for complete search history.

(56) References Cited

U.S. PATENT DOCUMENTS 6,114,243 A * 9/2000 Gupta et al. ................ 438/687
2004/0214431 A1* 10/2004 Shieh et al. ................. 438/689

* cited by examiner

*Primary Examiner*—Chuong A. Luu
(74) *Attorney, Agent, or Firm*—Rabin & Berdo, P.C.

(57) ABSTRACT

A method for manufacturing a semiconductor device is provided. First, a first metal conductive line is formed, and then a semiconductor device is formed on the first metal conductive line. A dielectric layer is formed on the semiconductor device. A contact window is formed at a position in the dielectric layer corresponding to the first metal conductive line. Then, a metal plug is formed in the contact window. The metal plug is used as a mask for etching the semiconductor device, such that the etched semiconductor device takes the form of a shape corresponding to the metal plug. Through the manufacturing method, the semiconductor device is formed according to the shape of the metal plug and is completely aligned with the metal plug.

13 Claims, 5 Drawing Sheets

METHOD FOR MANUFACTURING A SEMICONDUCTOR DEVICE, METHOD FOR MANUFACTURING MAGNETIC MEMORY, AND THE MAGNETIC MEMORY THEREOF

CROSS-REFERENCE TO RELATED APPLICATIONS

This non-provisional application claims priority under 35 U.S.C. § 119(a) on patent application No. 095100379 filed in Taiwan, R.O.C. on Jan. 4, 2006, the entire contents of which are hereby incorporated by reference.

BACKGROUND OF THE INVENTION

1. Field of Invention

The present invention relates to a method for manufacturing a semiconductor device, and more particularly, to a method for manufacturing a magnetic memory with self-aligned magnetic tunnel junction.

2. Related Art

Magnetic random access memory (MRAM) is a type of non-volatile memory, which is used to store and record information according to the resistance characteristic and has the advantage of non-volatility, high intensity, high read and write speed, anti-radiation, etc. The general method for writing data is to utilize two current lines, the bit line and write word line. A magnetic memory cell selected by the intersection of the bite line and the write word line through the magnetic field inducting, wherein the value of resistance is changed by transferring the magnetic direction of the ferromagnetic free layer. While reading data from MRAM, the current provided for the selected magnetic memory cell is applied to the resistance measuring of the selected magnetic memory cell to determine the digital value of the data.

The magnetic memory cell manufactured between the bit line and the write word line is a stack structure of multiple magnetic metal material layers, formed by stacking a soft ferromagnetic layer, a tunnel barrier layer, a hard ferromagnetic layer, an anti-ferromagnetic layer, and a nonmagnetic conductor. Through the parallel or anti-parallel magnetic direction between the two ferromagnetic layers stacked on two side of the tunnel barrier layer respectively, a bit is determined to be "1" or "0". However, element failures often occur due to the difficulty in controlling the manufacturing process. Particularly, the contact area between the metal plug and the magnetic junction element is less than 0.05 µm; therefore, the magnetic junction element is often damaged, due to the etching resulted from the aligning deviation between the metal plug and the magnetic junction element, or due to the metal plug being bigger than the magnetic junction element. Thus, a short circuit finally occurs for the magnetic junction element.

With the technical trend that the element size and the memory area is being gradually reduced, one often encounters the difficulty in the overlaying contact between the magnetic junction element and the metal plug, which results in a short- circuit in the magnetic junction element.

SUMMARY OF THE INVENTION

In order to solve the problem of the overlaying contact between the metal plug and a small sized element, the present invention discloses a method for manufacturing a semiconductor device to overlay the metal plug with the semiconductor device.

According to an embodiment of the method for manufacturing a semiconductor device in the present invention, first, a first metal conductive line is formed, and then a semiconductor device is formed on the first metal conductive line. A dielectric layer is formed on the semiconductor device. A contact window is formed at a position in the dielectric layer corresponding to the first metal conductive line. Then, a metal plug is formed in the contact window. The metal plug is used as a mask for etching the semiconductor device, such that the etched semiconductor device takes the form of a shape corresponding to the metal plug.

Through the manufacturing method in the present invention, the semiconductor device is formed according to the shape of the metal plug, and is completely aligned with the metal plug.

The above descriptions about the content of the present invention and the illustration below of embodiments are intended to exemplify and explain the spirits and principle of the present invention, and the claims of the present invention will be further illustrated.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

Specific features and advantages of the present invention are described in detail through the following embodiments, which is sufficient for those skilled in the art to understand the technical contents of the present invention and to implement the present invention accordingly. Those skilled in the art will easily appreciate the objects and advantages related to the present invention according to the contents, claims, and drawings of the present specification.

Referring to FIGS. 1 to 8, they show the method for manufacturing a semiconductor device according to the present invention, wherein a magnetic memory with self-aligned magnetic tunnel junction is taken as an example.

Figure 1:
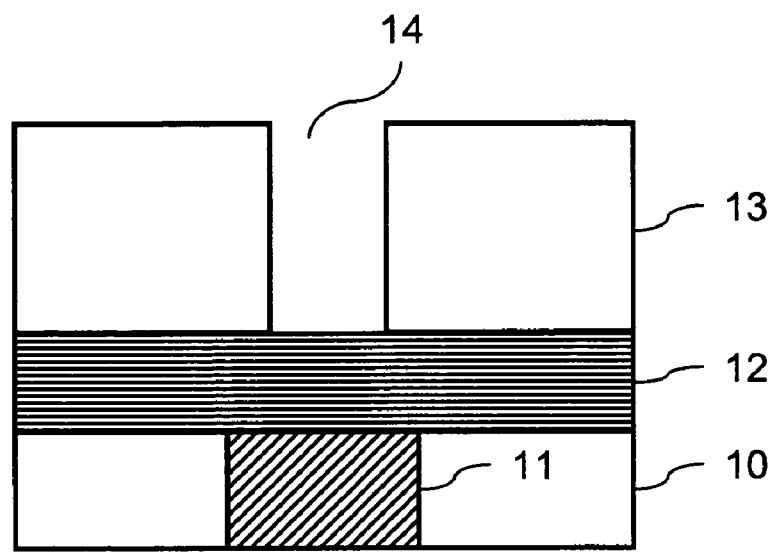
FIGS. 1 to 8 show a method for manufacturing a magnetic memory with self-aligned magnetic tunnel junction according to the present invention.

As shown in FIG. 1, first, a first metal conductive line 11 is formed in a dielectric layer 10 through deposition. Then, a magnetic tunnel junction (MTJ) layer 12 is deposited by sputtering, and then a dielectric layer 13 is deposited. A contact window 14 is defined at a position corresponding to the first metal conductive line 11 through a photolithography process. The dielectric layer 13 can be deposited by, e.g., low-temperature oxidation (LTO) process.

The magnetic tunnel junction layer 12 is, for example, a structure of multiple layers, sequentially consisting of a buffer layer, an anti-ferromagnetic layer, a pinned layer, a tunnel insulation layer, and a free layer from the top to bottom. For example, the buffer layer can be made of NiFe or NiFeCr. The anti-ferromagnetic layer can be made of PtMn or MnIr. The pinned layer can be more than one ferromagnetic layer, or an artificial anti-ferromagnetic layer with a three-layered structure, made of CoFe/Ru/CoFe or CoFe/Ru/CoFeB. The tunnel insulation layer is made of AlOx. The free layer can be more than one ferromagnetic layer, or an artificial anti-ferromagnetic layer with a three-layered structure. The ferromagnetic layer can be made of NiFe/CoFe and CoFeB, and the artificial anti-ferromagnetic layer can be made of CoFe/Ru/CoFe or CoFeB/Ru/CoFeB. The materials and structures enumerated above are only for sake of illustration, and those with ordinary skills in this field will understand that other equivalent magnetic materials capable of achieving the same effect also can be used.

Figure 2:
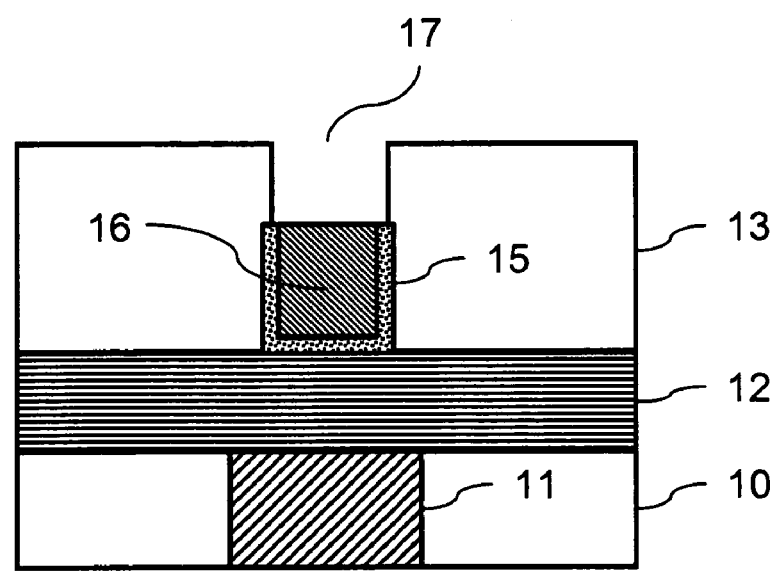

Referring to FIG. 2, a first barrier layer 15 is then deposited in the contact window 14. The first barrier layer 15 is mainly formed by TiN, and has two different manufacturing methods: one is to prepare it by nitridation; the other is to deposit it by reactive sputtering. Using TiN to form the first barrier layer 15 can prevent copper ions in different metal layers from diffusing into the silicon substrate, and meanwhile enhance the adhesive force between the copper wire and the dielectric layer.

As for the nitridation process, Ti with a certain thickness is deposited on the chip surface by way of magnetron direct current sputtering (magnetron DC sputtering). Then, the chip is disposed in an environment containing $N_2$ or $NH_3$, and under high temperature, the Ti metal layer is nitrogenized into TiN. In order to reduce the thermal budget for nitridation and to guarantee the shallow junction between the contact metal and the element, a rapid thermal process can be used to perform the step of nitrogenizing Ti.

As for the reactive sputtering, Ti is sputtered out from a Ti target metal material by the ionic bombardment under the reactive gas combined of argon and nitrogen, and then takes the form of TiN with N atoms formed by dissociation reaction within the plasma, and then TiN is deposited on the chip surface. Usually, the thickness of TiN used as a barrier layer is between about 50 nm to 150 nm. The sputtering pressure of the direct current sputtering and reactive sputtering may range from about several m-Torr to 100 m-Torr in the manufactured process.

After the first barrier layer 15 has already been formed, a metal plug 16 is formed by the chemical vapor deposition, which can be made of metal materials, such as tungsten. Then, the barrier layer 15 and the metal plug 16 are made with etch-back to form a recess 17. The way of etch-back to form a recess can be appreciated with reference to the content disclosed by CY.Ho, SY.Hou in "Study of W-plug loss with CVD Tin glue formed by TDMAT of metal via application, VLSI Multilevel interconnect Conference 1998, P171-P174".

Figure 3:
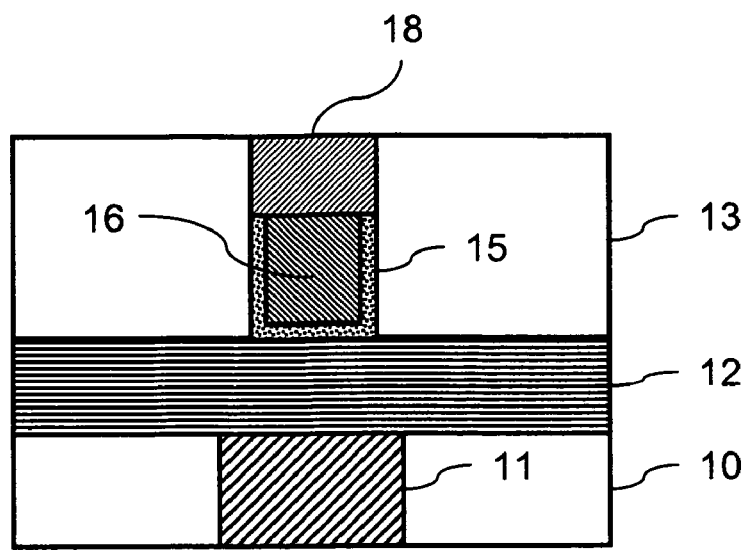

Referring to FIG. 3, a photoresist 18 is filled into the recess 17 to fill up the space left after the process of etch-back.

Figure 4:
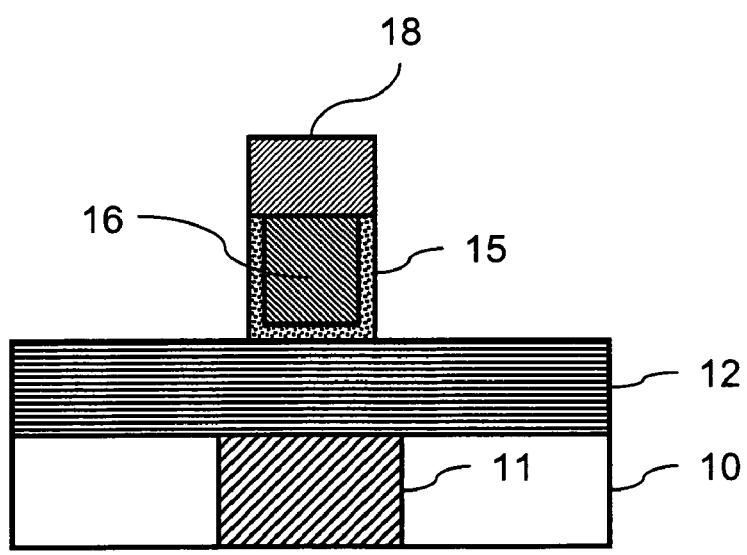

Referring to FIG. 4, the formed metal plug 16 and the photoresist 18 are used to be as masks, and then the dielectric layer 13 is etched with until the magnetic tunnel junction layer 12 is exposed.

Figure 5:
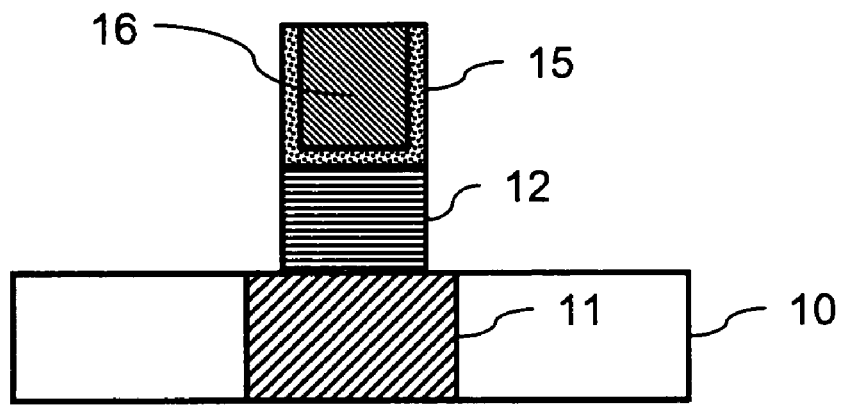

Referring to FIG. 5, it shows that the magnetic tunnel junction layer 12 is etched. The magnetic tunnel junction layer 12 is etched with the metal plug 16 shown in FIG. 5 as a mask. The etched magnetic tunnel junction layer 12 takes the form of a shape corresponding to that of the metal plug 16. In this step, the photoresist 18 is also removed. With the metal plug 16 as a mask, the magnetic tunnel junction layer 12 is formed according to the shape of the metal plug 16; and meanwhile, the magnetic tunnel junction layer 12 and the metal plug 16 are completely aligned with each other.

After the step of manufacturing the aligned magnetic tunnel junction layer 12 and the metal plug 16 has finished, the manufacturing process of bit lines will be performed.

Figure 6:
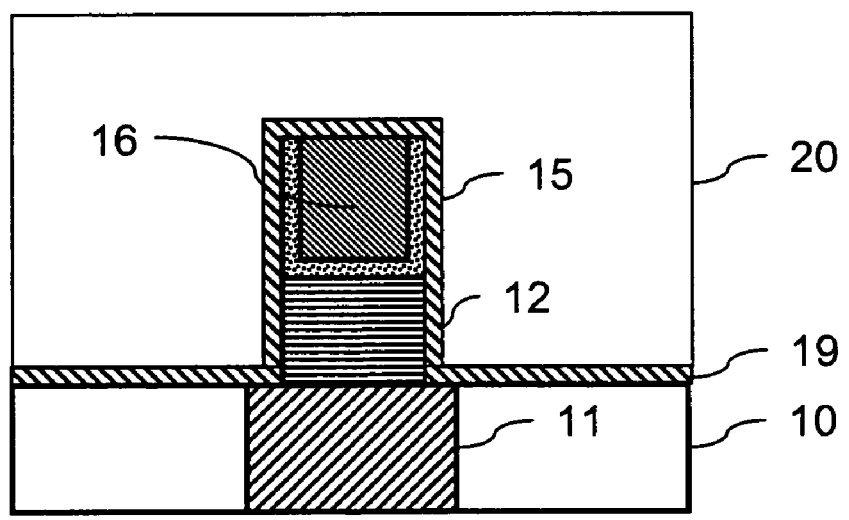
Figure 7:
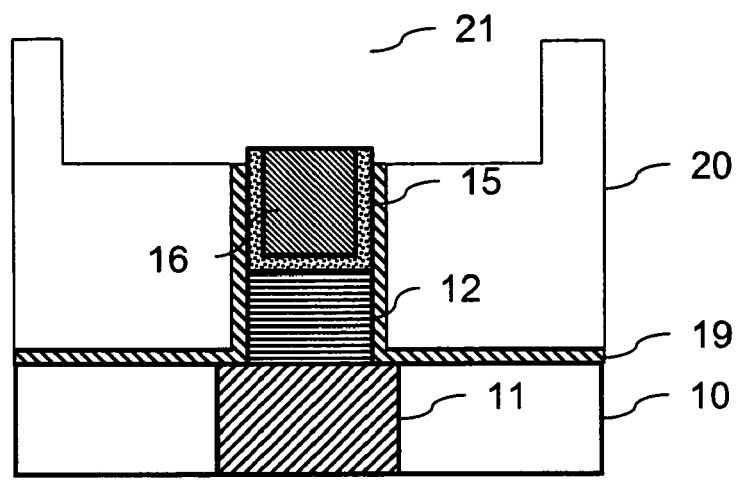
Figure 8:
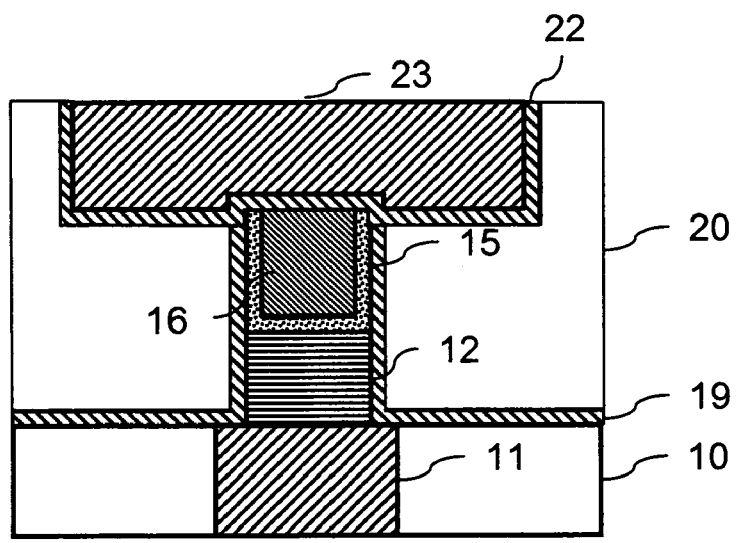

Referring to FIG. 6, a protection layer 19 is then deposited to cover the aligned magnetic tunnel junction layer 12 and the metal plug 16. The protection layer 19, for example, can employ a low temperature nitride (LTN) layer or a low temperature oxide (LTO) layer. Further, an insulation layer 20 is deposited to cover the protection layer 19. Then, the insulation layer 20 is etched to form an inlay portion 21, as shown in FIG. 7. Finally, a second barrier layer 22 is deposited in the inlay portion 21. The second barrier layer 22 is mainly formed by TiN, and has two different manufacturing methods: one is to prepare it by nitridation; the other is to deposit it by reactive sputtering. Finally, the metal material is sputtered thereon to form a second metal layer 23 to act as the bit line, as shown in FIG. 8.

With the above process, even though an over-etching phenomenon occurs when the inlay portion 21 is formed, the magnetic tunnel junction layer 12 will not be damaged due to the metal plug 16.

Figure 9:
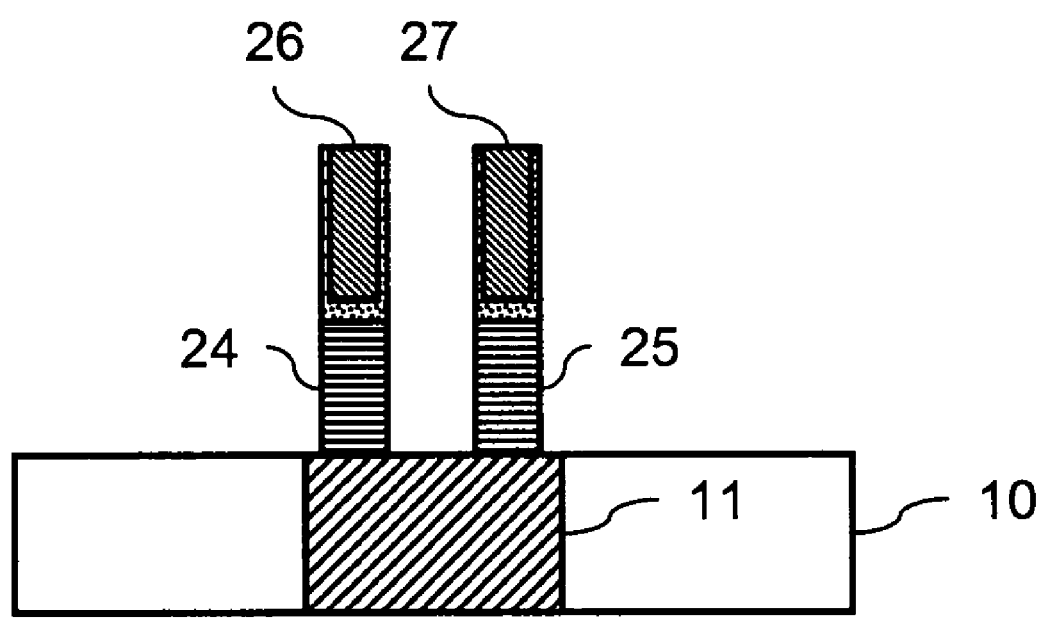
FIG. 9 is another embodiment of the method for manufacturing the magnetic memory with self-aligned magnetic tunnel junction according to the present invention.

Referring to FIG. 9, it is another embodiment of the manufacturing method of the present invention. When the shape of the magnetic tunnel junction layer 12 is shaped as that of a sweet bun, the method of the present invention also can be employed. As shown, the magnetic tunnel junction layers 24, 25 are etched with the metal plugs 26, 27 as masks. The etched magnetic tunnel junction layers 24, 25 will be formed into the shapes corresponding to that of the metal plugs 26, 27.

The magnetic tunnel junction layers with different shapes are mentioned in the prior art, and through the manufacturing method disclosed by the present invention, the magnetic tunnel junction layer will be formed with a shape corresponding to that of the metal plug; and meanwhile the magnetic tunnel junction layer and the metal plug are completely aligned with each other.

Although the above manufacturing method is illustrated with a magnetic memory as an example, it is not intended to limit the objects manufactured by the method of the present invention, and the manufacturing method of the present invention also can be applied to other manufacturing processes that require an alignment process, such as the semiconductor device, the transistor, and the like.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a semiconductor device, comprising:
   forming a first metal conductive line;
   forming an operative layer on the first metal conductive line;
   forming a dielectric layer on the operative layer, wherein a contact window is formed at a position in the dielectric layer corresponding to the first metal conductive line;
   forming a metal plug in the contact window, and forming a recess on the metal plug through an etch-back process;
   depositing a photoresist in the recess;
   etching the dielectric layer, until the operative layer is exposed; and etching the operative layer using the metal plug as a mask, wherein the etched operative layer forms an operative body with a shape corresponding to that of the metal plug.

2. The manufacturing method as claimed in claim 1, wherein the operative layer is a magnetic tunnel junction layer, and the operative body is a magnetic tunnel junction body.

3. The manufacturing method as claimed in claim 1, further comprising a step of forming a first barrier layer between the contact window and the metal plug.

4. The manufacturing method as claimed in claim 3, wherein the first barrier layer is formed by nitridation.

5. The manufacturing method as claimed in claim 3, wherein the first barrier layer is formed by reactive sputtering.

6. The manufacturing method as claimed in claim 1, wherein the dielectric layer is a low temperature oxide layer.

7. The manufacturing method as claimed in claim 2, further comprising:

depositing a protection layer for covering the etched magnetic tunnel junction body and the metal plug;

depositing an insulation layer for covering the protection layer;

etching the insulation layer to form an inlay portion; and depositing a second metal layer within the inlay portion.

8. The manufacturing method as claimed in claim 7, further comprising a step of forming a second barrier layer between the inlay portion and the second metal layer.

9. The manufacturing method as claimed in claim 8, wherein the second barrier layer is formed by nitridation.

10. The manufacturing method as claimed in claim 8, wherein the second barrier layer is formed by reactive sputtering.

11. A method for manufacturing a semiconductor device, comprising:

forming a first metal conductive line;

forming a magnetic tunnel junction layer on the first metal conductive line;

forming a dielectric layer on the magnetic tunnel junction layer, wherein a contact window is formed at a position in the dielectric layer corresponding to the first metal conductive line;

forming a metal plug in the contact window, and forming a recess on the metal plug through an etch-back process;

depositing a photoresist in the recess;

etching the dielectric layer, until the magnetic tunnel junction layer is exposed;

etching the magnetic tunnel junction layer with the metal plug as a mask, wherein the etched magnetic tunnel junction layer forms a magnetic tunnel junction body with a shape corresponding to that of the metal plug;

depositing a protection layer for covering the magnetic tunnel junction body and the metal plug;

depositing an insulation layer for covering the protection layer;

etching the insulation layer to form an inlay portion; and depositing a second metal layer within the inlay portion.

12. The manufacturing method as claimed in claim 11, wherein the protection layer is a low temperature oxide layer.

13. The manufacturing method as claimed in claim 11, wherein the protection layer is a low temperature nitride layer.

* * * * *